United States Patent [19]
Saito et al.

[11] Patent Number: 5,734,262
[45] Date of Patent: Mar. 31, 1998

[54] MATRIX OF SWITCHED ANTENNA ELEMENTS HAVING A CONDUCTOR PATTERN SUPPORTED ON INDIVIDUAL INSULATORS FOR MEASURING ELECTROMAGNETIC RADIATION

[75] Inventors: Yutaka Saito, Ishikawa-ken; Yukimichi Okamura, Fujisawa, both of Japan

[73] Assignee: Matsushita Electric Industrial Co., Ltd., Osaka, Japan

[21] Appl. No.: 608,088

[22] Filed: Feb. 28, 1996

[30] Foreign Application Priority Data

Mar. 1, 1995 [JP] Japan .................. 7-041620

[51] Int. Cl.$^6$ .................. G01R 23/04; G01R 29/08
[52] U.S. Cl. .................. 324/95
[58] Field of Search .................. 324/95; 342/373; 343/853, 855, 866, 870, 873, 878, 893

[56] References Cited

U.S. PATENT DOCUMENTS

| | | | |
|---|---|---|---|
| 3,919,638 | 11/1975 | Belden, Jr. ................. | 324/95 |
| 4,531,126 | 7/1985 | Sadones ................. | 342/173 |
| 4,829,238 | 5/1989 | Goulette et al. ................. | 324/95 |
| 5,189,433 | 2/1993 | Stern et al. ................. | 343/770 |
| 5,210,541 | 5/1993 | Hall et al. ................. | 343/700 MS |
| 5,247,310 | 9/1993 | Waters ................. | 342/368 |
| 5,276,455 | 1/1994 | Fitzsimmons et al. ................. | 343/777 |
| 5,406,209 | 4/1995 | Johnson et al. ................. | 324/750 |
| 5,495,258 | 2/1996 | Muhlhauser et al. ................. | 343/753 |

FOREIGN PATENT DOCUMENTS

| | | |
|---|---|---|
| 0621653 | 10/1994 | European Pat. Off. . |
| 0634808 | 1/1995 | European Pat. Off. . |
| 5-67184 | 9/1993 | Japan . |
| 6-324122 | 11/1994 | Japan . |
| 9009042 | 8/1990 | WIPO . |

OTHER PUBLICATIONS

Bahl, I.J. and Bharitia, P., "Microstrip Antennas," Artech House, Inc., Norwood, MA, pp. 18–28, 174–177, 212–219, 234–238, and 320–321 (1980) (month unavailable).

Daniel, J.P., et al, "Research On Planar Antennas and Arrays: 'Structures Rayonnantes'", 8082a IEEE Antennas & Propagation Magazine 35 (1993) Feb., No. 1, New York pp. 14–38.

Primary Examiner—Ernest F. Karlsen
Assistant Examiner—Russell M. Kobert
Attorney, Agent, or Firm—Pollock, Vande Sande & Priddy

[57] ABSTRACT

An electromagnetic radiation measuring device includes a plurality of antenna elements arranged in a matrix. Each antenna element includes an insulator having a substantially rectangular parallelepiped shape, supporting at least one conductor pattern. The first and second ends of the conductor pattern are connected to first and second print patterns on a printed circuit board. A detection signal is selectively provided by a switching device from at least one conductor pattern of each antenna element.

7 Claims, 6 Drawing Sheets

MATRIX OF SWITCHED ANTENNA ELEMENTS HAVING A CONDUCTOR PATTERN SUPPORTED ON INDIVIDUAL INSULATORS FOR MEASURING ELECTROMAGNETIC RADIATION

BACKGROUND OF THE INVENTION

1. Field of the Invention

This invention relates to an electromagnetic radiation measuring apparatus for measuring an electromagnetic radiation from a target electric circuit apparatus.

2. Description of the Prior Art

An electromagnetic radiation measuring apparatus for measuring an electromagnetic radiation from a target electric circuit is known. FIG. 10 is a cross-sectional view of each of antenna portions of a prior art electromagnetic radiation measuring apparatus. The antenna portion of the prior art electromagnetic radiation measuring apparatus comprises a multi-layer printed-circuit board 11, a print pattern 12 formed on a top surface of the multi-layer printed-circuit board 11, via holes 13 and 14 connected to form an open wire loop structure, and a switching element 10 for selectively outputting a detection signal derived from a detected electromagnetic radiation from the via hole 14. In FIG. 10, references L' and h' represents horizontal and vertical lengths of the open wire loop structure respectively and reference hb denotes a thickness of the multi-layer printed-circuit board 11.

An electromagnetically induced voltage is proportional to an opening area of the open wire loop structure, that is, $S'=(L' \times h')$. Therefore, each of the antenna portions has a sensitivity proportional to the opening area S' and producing the detection signal and the switching circuit outputs the detection signal from successively selecting one of antenna portions.

SUMMARY OF THE INVENTION

The aim of the present invention is to provide an improved electromagnetic measuring apparatus.

According to the present invention there is provided an electromagnetic radiation measuring apparatus, comprising: a plurality of antenna elements matrix-arranged responsive to electromagnetic waves; a printed circuit board having plural sets of first and second print patterns; and a switching circuit. Each antenna element includes: an insulator having a substantially rectangular parallelepiped; at least one conductor pattern on at least a surface of the rectangular parallelepiped; and connecting portions for mechanically and electrically connecting the conductor pattern to the first and second print patterns of each set. The switching circuit selectively produces a detection signal generated by the conductor pattern of each antenna element in response to the electromagnetic waves. In this apparatus, the conductor pattern may have a straight line portion having a constant width or may have a circle shaped portion or may have an oval shaped portion. In this apparatus, the conductor pattern may be spirally wound around the insulator by at least a turn such that an axis of at least a conductor spirally wound is parallel to the printed circuit board. Each antenna element may have a plurality of conductor patterns. Moreover, the conductor is arranged on a top surface of the insulator and the connecting portions comprise first and second electrodes for providing connections between the conductor and the first and second print patterns respectively.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
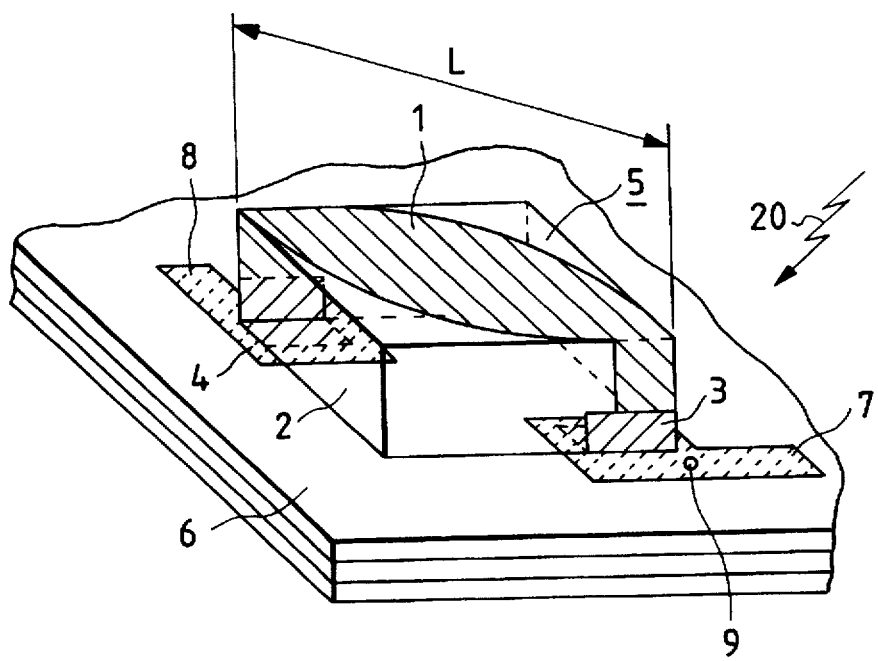
FIG. 1 is a perspective view of a portion of an electromagnetic radiation measuring apparatus including a plurality of antenna elements of the first embodiment, wherein one of antenna elements is shown.
Figure 2:
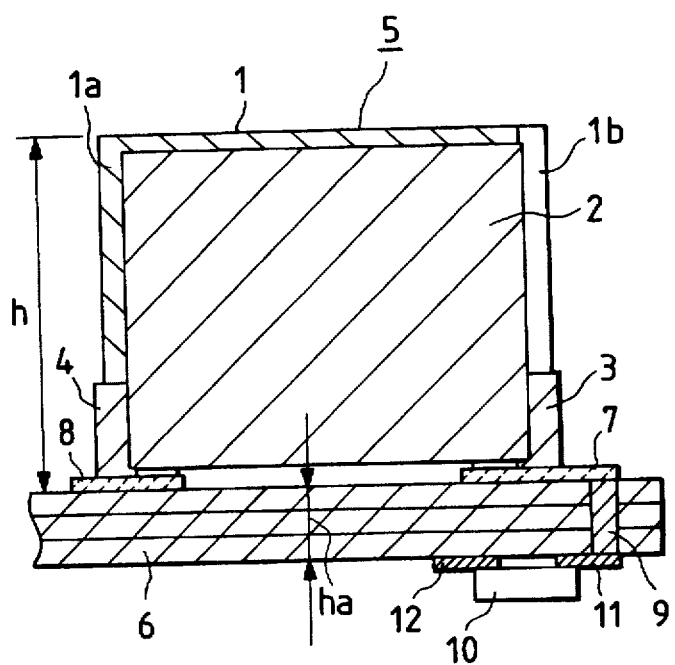
FIG. 2 is a cross-sectional view of the antenna element of the electromagnetic radiation measuring apparatus of the first embodiment, wherein the antenna element is sectioned on a line which is derived by slightly twisting a line on a diagonal of the rectangular of the top surface of the antenna element shown in FIG. 1 around the center of the rectangular.
Figure 9:
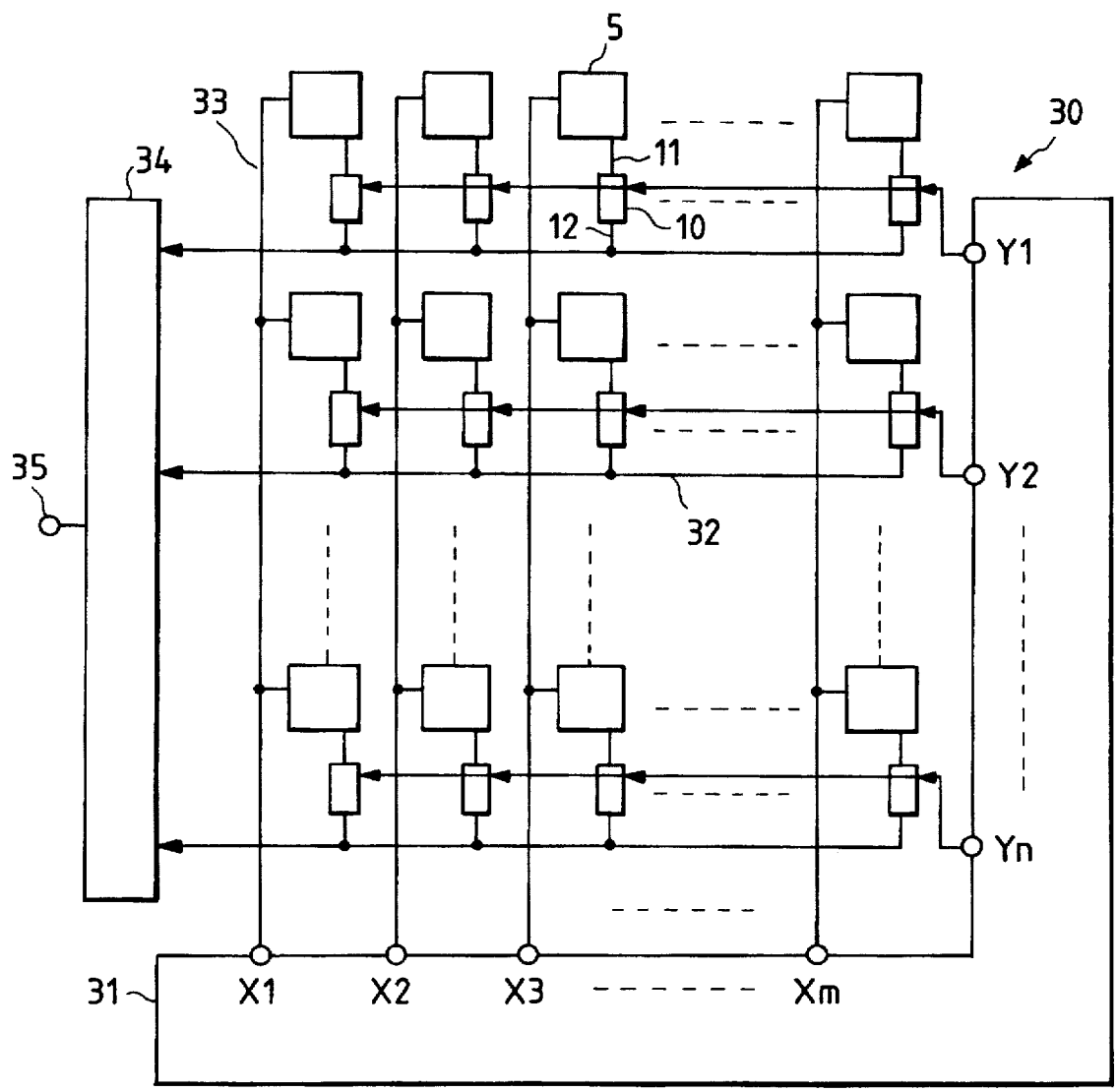
FIG. 9 is a circuit diagram of an electromagnetic radiation measuring apparatus of an embodiment this invention.
Figure 10:
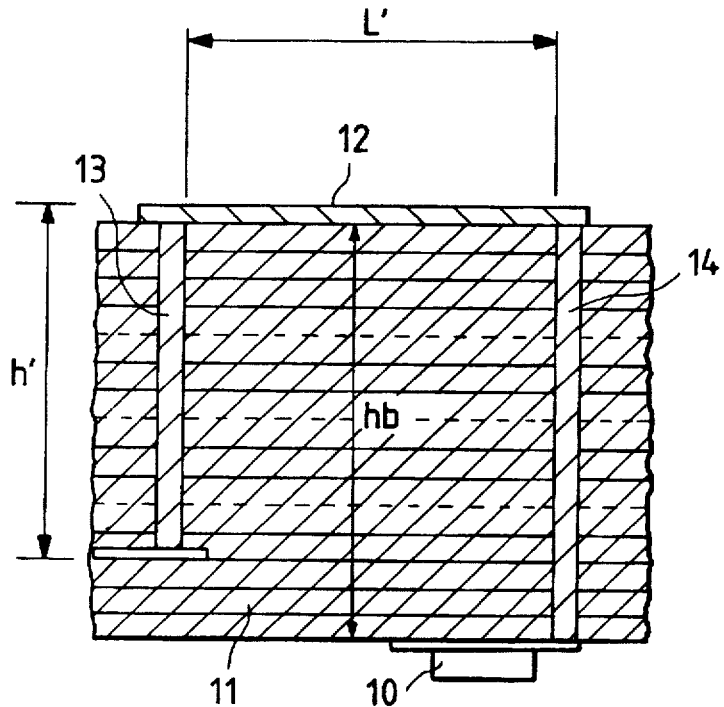
FIG. 10 is a cross-sectional view of each of antenna portions of a prior art electromagnetic radiation measuring apparatus.

FIG. 1 is a perspective view of a portion of an electromagnetic radiation measuring apparatus including a plurality of antenna elements of the first embodiment, wherein one of antenna elements is shown. FIG. 2 is a cross-sectional view of the antenna element of the electromagnetic radiation measuring apparatus of the first embodiment, wherein the antenna element is sectioned on a line which is derived by slightly twisting a diagonal of the rectangular of the top surface of the antenna element 5 around the center of the rectangular. FIG. 9 is a circuit diagram of the electromagnetic radiation measuring apparatus of this invention. The electromagnetic radiation measuring apparatus comprises a multi-layer printed-circuit board 6, an antenna matrix including a plurality of antenna elements 5, and a switching circuit 30 including a plurality of switching elements 10. Each of antenna elements 5 has a rectangular parallelepiped electrical insulator 2 mounted on the multi-layer printed circuit board 6. The antenna element 5 has a conductor pattern 1 on a top surface and side surfaces of the electrical insulator 2, electrodes 3 and 4 perpendicularly bent to partially cover the conductor pattern 1 on the side surfaces and a bottom surface of the electrical insulator 2. The multi-layer printed circuit board 6 has print patterns 7 and 8 on a top surface of the multi-layer printed circuit board 6 to provide electronic contacts between the electrodes 3 and 4 and the conductor pattern 11, a via hole 9 formed through the multi-layer printed circuit board 6 for coupling the print pattern 7 and the print pattern 11, to the switching element 10. The switching circuit 30 selectively supplies each of outputs of the conductor patterns 1. The electrodes 3 and 4 are electrically connected to the print patterns 7 and 8 by soldering or the other corresponding method. The antenna loop structure including the conductor pattern 1 receives electromagnetic waves 20 and generates a detection signal. The detection signal from the conductor pattern 1 is supplied to the switching element 10 via the electrode 3 and the print pattern 7, the via hole 9, and the print pattern 11.

The switching circuit 30 comprises the switching elements 10 arranged to have a matrix structure corresponding to the antenna matrix (Xm, Yn) of the antenna elements 5, a control circuit 31 for controlling the switching elements 10 and antenna elements 5 to output the detection signals from respective antenna elements 5, output conductors 32 for supplying one of the detection signals from one antenna element 5 selected by the control circuit 31, and an outputting circuit 34 for outputting the detection signal from the selected antenna element 5. In other words, each of the antenna elements 5 having the matrix structure (Xm, Yn) is scanned by the control circuit 31 to successively output each detection signal from each of antenna elements 5.

Figure 3:
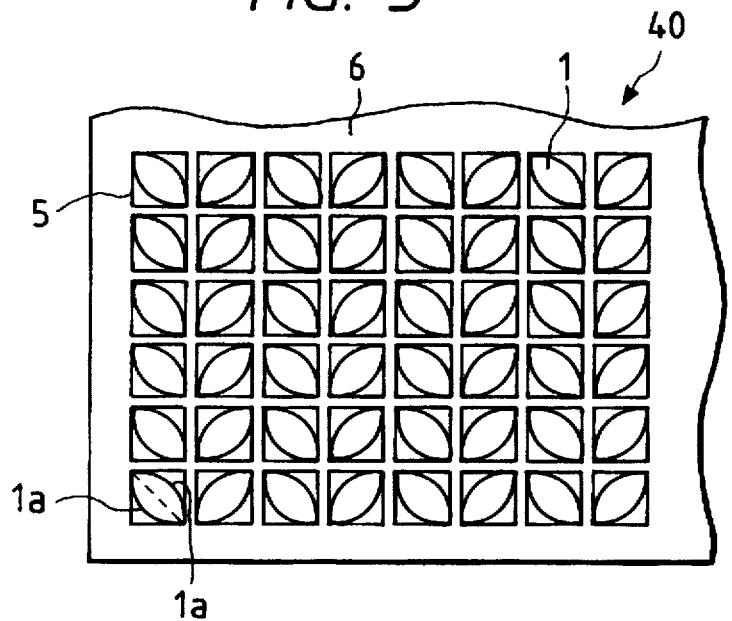
FIG. 3 is a plan view of an electromagnetic radiation measuring apparatus of an embodiment of this invention showing an arrangement of the antenna elements.

FIG. 3 is a plan view of the electromagnetic radiation measuring apparatus of this embodiment, wherein an arrangement of the antenna elements, i.e., the antenna matrix is shown. A plurality of the antenna elements 5 are arranged on the top surface of the multi-layer printed board 6 to provide the matrix structure of the antenna elements 5. Each of the switching elements 10 successively supplies the detection signals to an external measuring equipment. Therefore, an electromagnetic radiation from an operated target printed circuit board is measured by this electromagnetic radiation apparatus using the external measuring equipment to determine a print pattern on the target printed circuit board which pattern generates a strong electromagnetic radiation.

In FIG. 3, one vertical line of the antenna matrix out of two consective lines is arranged to have a loop direction perpendicular to the loop direction of the other vertical line of the consective two lines of antenna elements to reduce an electromagnetic coupling or interference between neighboring antenna elements 5. However, this arrangement pattern or loop directions of the antenna elements 5 can be modified.

In FIGS. 1 and 2, reference L denotes a horizontal length of the antenna element 5, reference h denotes a height of the antenna element 5, and ha represents a thickness of the multi-layer printed circuit board 6.

Generally, the electromagnetic induction voltage from an antenna having the wire loop is proportional to an opening area of the wire loop, that is, S=L×h. Therefore, a sensitivity of the antenna with respect to electromagnetic radiation is determined by the opening area S. The antenna element 5 has a sufficient opening area because the height h can be determined freely by determining the height of the electrical insulator 2 having a rectangular parallelepiped. Moreover, the conductor pattern 1 is arranged in the direction of the diagonal of the rectangle of the top surface of the antenna element 5, so that the length of the conductor pattern 1 in the horizontal direction is made larger if the size of the electrical insulator is the same. Moreover, the thickness of the printed circuit board 6 can be determined irrespective of the sensitivity of the antenna element 5.

Stray capacitances of the antenna element 5 shown in FIG. 2, are generated between a wire loop including the conductor pattern 1 and other pattern on the multi-layer printed circuit board 6 through the air and the electrical insulator 2. The electrical insulator 2 supporting the wire loop is made by molding a plastic, so that a dielectric constant of the electric insulator 2 can be determined freely to some extent. Therefore, the dielectric constant of the electric insulator 2 can be made smaller than that of the multi-layer printed circuit board 6. Moreover, the air has a dielectric constant lower than the multi-layer printed circuit board 6. Therefore, a total stray capacitance of the antenna element 5 can be made small, so that a frequency characteristic of the antenna element 5 can be improved.

Figure 11A:
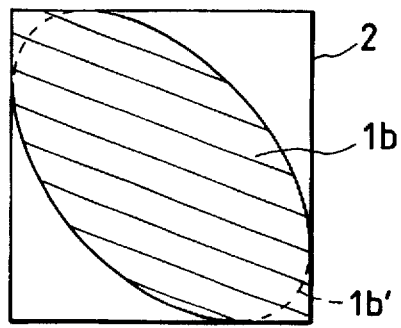
FIGS. 11A and 11B are plan views of the antenna elements of the first embodiment.
Figure 11B:
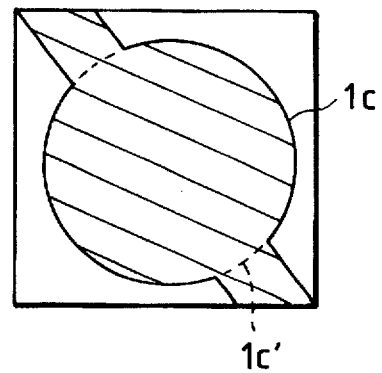

A portion of the conductor pattern 1 on the top surface of the electrical insulator 2 is formed to have a shape of a cross section of a biconvex lens. More specifically, as shown in FIG. 3, the conductor pattern 1 has two symmetrical partial circle shaped portions 1a. That is, a width of the conductor pattern 1 increases from the ends to the middle of the portion of the conductor pattern on the top surface of the electrical insulator 2. This structure improves a directivity of the antenna element 5. Generally, a straight loop antenna having a constant width has a directivity graphically represented by a radiation pattern in the shape of "8". That is , the directivities in the 90 degrees and 270 degrees from the maximum radiation direction are low. However, this structure of the conductor pattern having a width thereof increasing from the ends to the middle of the portion of the conductor pattern on the top surface of the electrical insulator 2 makes a current distribution directions dispersed, so that a sharp directivity which would be provided in the antenna element having a straight conductor pattern can be modulated. This structure improves a deviation in sensitivity due to various directions of magnetic components radiated from a target printed circuit board, that is, various directions of printed circuit patterns. FIGS. 11A and 11B are plan views of the antenna elements of the first embodiment. In FIG. 11A, the conductor pattern 1b is formed to have an oval 1b' at the middle of the conductor pattern 1b. In FIG. 11B, the conductor pattern 1c is formed to have a circle 1c' at the middle of the conductor pattern 1c.

In this embodiment, an area of the conductor pattern tends to be large because the middle portion is formed to have a larger width as mentioned above, so that this structure tends to increase a stray capacitance between the conductor pattern 1 and the other patterns. However, as mentioned, the dielectric constant of the electrical insulator 2 is made low, so that an increase in the stray capacitance can be made small.

A second embodiment will be described.

Figure 4:
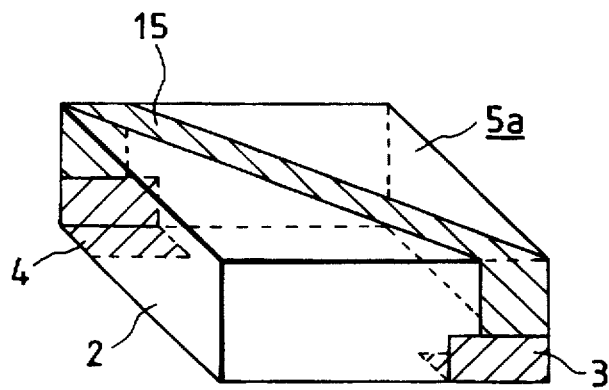
FIG. 4 is a perspective view of an antenna element 5a used in the electromagnetic radiation measuring apparatus of a second embodiment.

FIG. 4 is a perspective view of an antenna element 5a of the second embodiment. The basic structure of an electromagnetic radiation measuring apparatus of the second embodiment is substantially the same as that of the first embodiment. The difference between this embodiment and the first embodiment is in the shape of the conductor pattern 1. That is, the conductor pattern 15 having a constant width replaces the conductor pattern 1 of the first embodiment and a plurality of antenna elements 5a are arranged on the multi-layer printed circuit board 6 as similar to the first embodiment. The antenna element 5a of the second embodiment provides a sharp directivity than the antenna element 5 of the first embodiment.

A third embodiment will be described.

Figure 5:
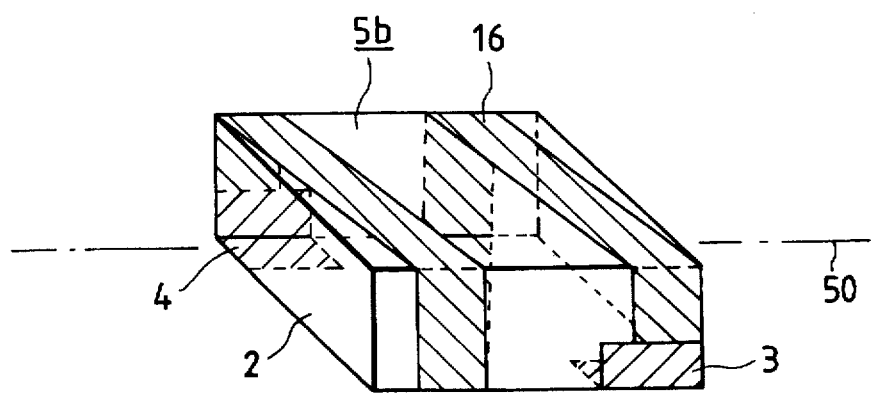
FIG. 5 is a perspective view of an antenna element used in the electromagnetic radiation measuring apparatus of a third embodiment.

FIG. 5 is a perspective view of an antenna element 5b used in the electromagnetic radiation measuring apparatus of the third embodiment. The basic structure of an electromagnetic radiation measuring apparatus of the third embodiment is substantially the same as the first embodiment. The difference between this embodiment and the first embodiment is in the conductor pattern. That is, the conductor pattern 16 having a constant width is wound around the electrical insulator by one and half turns in place of the conductor pattern 1 of the first embodiment which is not wound and a plurality of antenna elements 5b are arranged on the multi-layer printed circuit board 6 as similar to the first embodiment. More specifically, the conductor pattern 16 is spirally wound around the insulator 2 by at least a turn such that an axis 50 of the conductor spirally wound is parallel to the printed circuit board 6.

The antenna element 5b of the third embodiment provides a larger opening area S of the loop antenna structure of the antenna element 5b. More specifically, the opening area S is twice that of the opening areas of the antenna elements 5 and 5a of the first and second embodiments. Therefore, a sensitivity of the antenna element 5b can be made larger than those of the first and second embodiments. In other words, the size of the antenna elements 5b can be reduced if each antenna element 5b has the same sensitivity as the first or second embodiment, the number of the antenna elements 5b arranged on the multi-layer printed circuit board 6 can be made large, so that a resolution of the detection of the detection signals can be provided with the same sensitivity.

A fourth embodiment will be described.

Figure 6:
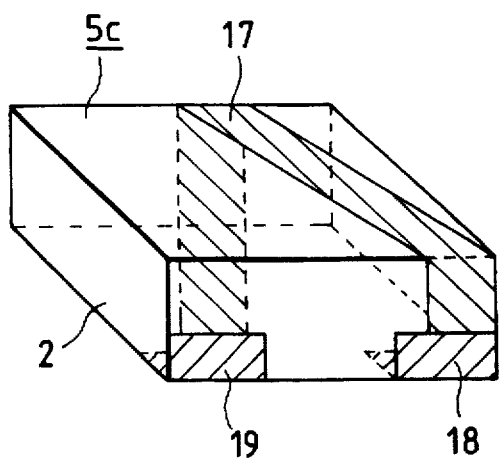
FIG. 6 is a perspective view of an antenna element of an electromagnetic radiation measuring apparatus of a fourth embodiment.

FIG. 6 is a perspective view of an antenna element 5c of an electromagnetic radiation measuring apparatus of the fourth embodiment. The basic structure of the fourth embodiment is substantially the same as that of the third embodiment. The difference between this embodiment and the third embodiment is in the conductor pattern. That is, the conductor pattern 16 having a constant width is wound around the electrical insulator by just one turn but a plurality of antenna elements 5c are arranged on the multi-layer printed circuit board 6 as similar to the third embodiment, wherein printed circuit patterns on the multi-layer printed circuits are modified because the electrodes 18 and 19 providing electrical conduction between the conductor pattern 17 forming a loop antenna structure and printed circuit patterns on the multi-layer printed circuit board 6 are formed on the same side surface of the electric insulator 2. The antenna element 5c of the fourth embodiment provides a compact area for mounting the antenna element 5c with a sufficient opening area S of the loop antenna structure of the antenna element 5c. More specifically, the electrodes 18 and 19 are arranged on the same side surface of the insulator 2, so that print patterns connected to the electrodes 18 and 19 are concentrated on the side of the side surface on which the electrodes 18 and 19 are formed, so that more antenna elements 5c can be mounted on the multi-layer printed circuit board 6 having the same surface area. Therefore, a resolution of the electromagnetic radiation measuring apparatus of this embodiment can be made larger than the third embodiment with the same sensitivity.

A fifth embodiment will be described.

Figure 7:
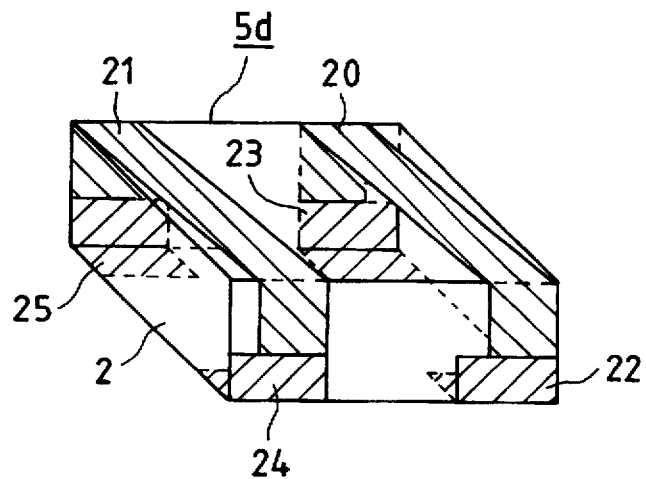
FIG. 7 is a perspective view of an antenna element of an electromagnetic radiation measuring apparatus of the fifth embodiment.

FIG. 7 is a perspective view of an antenna element 5d of an electromagnetic radiation measuring apparatus of the fifth embodiment. The basic structure of an electromagnetic radiation measuring apparatus of the fifth embodiment is substantially the same as the second embodiment. The difference between this embodiment and the second embodiment is in that two conductor patterns are provided on the insulator 2. That is, the conductor patterns 20 and 21, each having a constant width, are wound around the electrical insulator 2 by about a half turn but a plurality of antenna elements 5d are arranged on the multi-layer printed circuit board 6 as similar to the second embodiment, wherein printed circuit patterns on the multi-layer printed circuits are modified because the electrodes 22 to 24 providing electrical conduction between the conductor patterns 20 and 21 forming loop antenna structures and printed circuit patterns on the multi-layer printed circuit board 6 are provided. In this embodiment, the conductor pattern 17 is spirally wound around the insulator 2 by at least a turn such that an opening area of at least a conductor spirally wound is parallel to the printed circuit board 6.

The antenna element 5d of the fifth embodiment can reduce the number of the antenna elements on the multi-layer printed circuit board if the resolution is the same as that of the second embodiment. In other words, if the size of the antenna elements 5d is the same as that of the second embodiment, the resolution in the direction of the opening area of the loop antenna structure of the antenna elements 5d is twice that of the previous embodiments.

In this embodiment, the number of the conductor patterns 20 and 21 is two. However, this number can be increased.

A sixth embodiment will be described.

Figure 8:
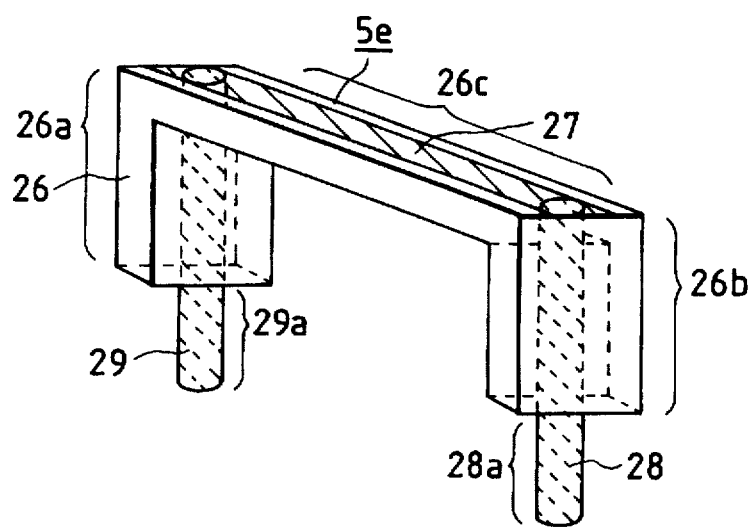
FIG. 8 is a perspective view of an antenna element of an electromagnetic radiation measuring apparatus of the sixth embodiment.

FIG. 8 is a perspective view of an antenna element 5e of an electromagnetic radiation measuring apparatus of the sixth embodiment.

The antenna element 5e of the sixth embodiment comprises an insulator 26 having a U-shape having two end portions 26a and 26b, and a middle portion 26c, a conductor pattern 27 on a top surface of the middle portion 26c of the U-shaped insulator 26, conductors 28 and 29 in the end portions 26a and 26b of the U-shaped insulator 26. One end of each of the conductors 28 and 29 is connected to each end of the conductor pattern 27. The other end of each of the conductors 28 and 29 extends from the end portions 26a and 26b of the U-shaped insulator 26. That is, the conductors 28 and 29 have extended portions 28a and 29a respectively.

A plurality of the antenna elements 5e are arranged on the multi-layer printed circuit board by inserting the extended portions 28a and 29a through through-holes provided in the multi-layer printed circuit board 6 and are soldered to contact with printed patterns (not shown) on the bottom surface of the multi-layer printed circuit board 6.

In the above mentioned embodiment, forming printed patterns on the multi-layer printed circuit board 6 does not require high accuracy because it is sufficient to make the size of the insulator even to provide even sensitivity of the loop antenna structure of each antenna element. Moreover, if one or more antenna elements are defective, such antenna elements can be replaced.

In the embodiments of this invention, the shape of the insulator is a rectangular parallelepiped. However, the shape of the insulator can be modified with the loop antenna structures of the above-mentioned embodiment.

The conductor patterns of the above-mentioned embodiments can be formed by mounting a copper plate or plating a conducting material on the surfaces of the insulator. The insulator 2 is made of a liquid crystal polymer or the like having a heat resistivity and a low dielectric constant.

As mentioned, the electromagnetic radiation measuring apparatus of this invention, comprises the plurality of antenna elements 5, 5a, 5b, or 5c arranged to have a matrix 40 responsive to electromagnetic waves 20, the printed circuit board 6 having a plurality of sets of first and second print patterns 7, and 8, and the switching circuit 30. Each antenna element has the insulator 2 having the substantially rectangular parallelepiped, at least a conductor pattern 1, having first and second ends 1a and 1b, on at least a surface of the rectangular parallelepiped, and a connecting portion including the electrodes 3, 4, 18, 19, 22 to 25 for mechanically and electrically connecting first and second ends to the first and second print patterns 7, 8 of each of the plurality of set of first and second print patterns. The switching circuit selectively outputs a detection signal generated by the conductor pattern 1 of each antenna element in response to the electromagnetic waves.

What is claimed is:

1. An electromagnetic radiation measuring apparatus, comprising:
    a plurality of antenna elements arranged in a matrix responsive to electromagnetic waves;
    a printed circuit board having a plurality of sets of first and second print patterns; and
    switching means;
    each antenna element having:
    an insulator having a substantially rectangular parallelepiped;
    at least one conductor pattern, having first and second ends, on at least a surface of said rectangular parallelepiped; and
    connecting means for mechanically and electrically connecting first and second ends to said first and second print patterns of each of said plurality of sets of first and second print patterns, said switching means selectively outputting a detection signal generated by said at least one conductor pattern of said each antenna element in response to said electromagnetic waves.

2. An electromagnetic radiation measuring apparatus, as claimed in claim 1, wherein said at least one conductor has a straight line portion having a constant width.

3. An electromagnetic radiation measuring apparatus, as claimed in claim 1, wherein said at least one conductor has a partial circle shaped portion.

4. An electromagnetic radiation measuring apparatus, as claimed in claim 1, wherein said at least one conductor has an oval shaped portion.

5. An electromagnetic radiation measuring apparatus, as claimed in claim 1, wherein said at least one conductor pattern is spirally wound around said insulator by at least a turn such that an axis of said at least one conductor spirally wound is parallel to said printed circuit board.

6. An electromagnetic radiation measuring apparatus, as claimed in claim 1, wherein each antenna element has a plurality of said conductor patterns.

7. An electromagnetic radiation measuring apparatus, as claimed in claim 1, wherein said at least one conductor is arranged on a top surface of said insulator and said connecting means comprises first and second electrodes for providing connections between said at least one conductor and said first and second print patterns respectively.

* * * * *